US007830640B2

(12) United States Patent
Dieny et al.

(10) Patent No.: US 7,830,640 B2
(45) Date of Patent: Nov. 9, 2010

(54) SPIN VALVE MAGNETORESISTIVE DEVICE WITH CONDUCTIVE-MAGNETIC MATERIAL BRIDGES IN A DIELECTRIC OR SEMICONDUCTOR LAYER ALTERNATIVELY OF MAGNETIC MATERIAL

(75) Inventors: Bernard Dieny, Lans en Vercors (FR); Bernard Rodmacq, Veurey Voroize (FR); Franck Ernult, Saint Egreve (FR)

(73) Assignee: Commissariat A L'Energie Atomique, Paris (FR)

( * ) Notice: Subject to any disclaimer, the term of this patent is extended or adjusted under 35 U.S.C. 154(b) by 0 days.

(21) Appl. No.: 12/271,734

(22) Filed: Nov. 14, 2008

(65) Prior Publication Data
US 2009/0290266 A1 Nov. 26, 2009

Related U.S. Application Data

(62) Division of application No. 10/492,493, filed on Apr. 9, 2004, now Pat. No. 7,453,672.

(30) Foreign Application Priority Data
Oct. 12, 2001 (FR) .................................. 01 13174
Oct. 10, 2002 (WO) ...................... PCT/FR02/03448

(51) Int. Cl.
*G11B 5/39* (2006.01)
(52) U.S. Cl. ..................................... 360/324; 360/324.2
(58) Field of Classification Search ...... 360/324–324.2; 257/421–427; 365/145, 158, 171–173; 428/810–816
See application file for complete search history.

(56) References Cited
U.S. PATENT DOCUMENTS
5,463,516 A 10/1995 Valet et al.

5,715,121 A 2/1998 Sakakima et al.
6,064,552 A 5/2000 Iwasaki et al.
6,233,172 B1 5/2001 Chen et al.

(Continued)

FOREIGN PATENT DOCUMENTS
EP 0 780 912 6/1997

(Continued)

OTHER PUBLICATIONS

LeClair, P. et al., "Tunnel conductance as a probe of spin polarization decay in Cu dusted Co/Al2O3/Co tunnel junctions", Applied Physics Letters, vol. 76, No. 25, pp. 3783-3785, Jun. 19, 2000.

*Primary Examiner*—A. J. Heinz
(74) *Attorney, Agent, or Firm*—Nixon Peabody LLP

(57) ABSTRACT

Magnetoresistive device comprising a spin valve formed from a stack of layers including at least two magnetic layers for which a relative orientation of their magnetisation directions are capable varying under influence of a magnetic field; at least one discontinuous dielectric or semiconducting layer with electrically conducting bridges at least partially passing through a thickness of the dielectric or semiconducting layer, the bridges configured to locally concentrate current that passes transversely through the stack; and means for circulating a current in the spin valve transverse to the plane of the layers, characterised in that the dielectric or semiconducting layer with electrically conducting bridges is arranged inside one of the magnetic layers.

15 Claims, 10 Drawing Sheets

U.S. PATENT DOCUMENTS

| | | |
|---|---|---|
| 6,686,068 B2 | 2/2004 | Carey et al. |
| 6,707,649 B2 | 3/2004 | Hasegawa et al. |
| 6,710,984 B1 | 3/2004 | Yuasa et al. |
| 6,781,799 B2 | 8/2004 | Seyama et al. |
| 6,828,785 B2 | 12/2004 | Hosomi et al. |
| 2002/0048128 A1* | 4/2002 | Kamiguchi et al. ...... 360/324.1 |
| 2003/0104249 A1 | 6/2003 | Okuno et al. |
| 2003/0197505 A1 | 10/2003 | Sakakima et al. |

FOREIGN PATENT DOCUMENTS

| | | |
|---|---|---|
| JP | 2000-340859 | 12/2000 |
| JP | 2001-68760 | 3/2001 |
| JP | 2002-208744 | 7/2002 |
| JP | 2003-8105 | 1/2003 |

* cited by examiner

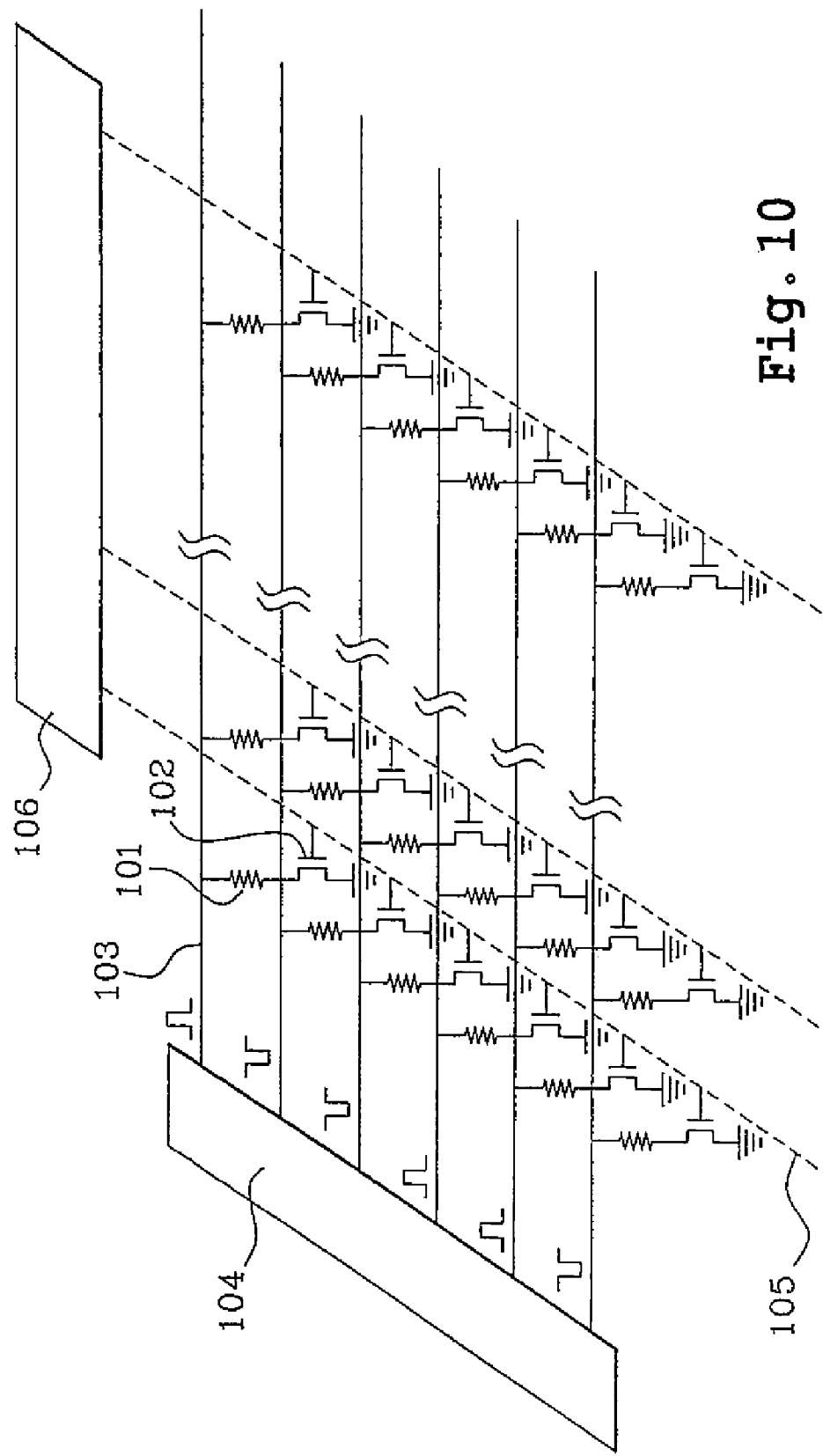

SPIN VALVE MAGNETORESISTIVE DEVICE WITH CONDUCTIVE-MAGNETIC MATERIAL BRIDGES IN A DIELECTRIC OR SEMICONDUCTOR LAYER ALTERNATIVELY OF MAGNETIC MATERIAL

CROSS REFERENCE TO RELATED APPLICATIONS

The present application is a divisional of U.S. patent application Ser. No. 10/492,493, filed Apr. 9, 2004 and now U.S. Pat. No. 7,453,672, which claims priority based on International Patent Application No. PCT/FR02/03448, entitled "Spin-Valve Magnetoresistive Device with Enhanced Performance" by Bernard Dieny, Bernard Rodmacq and Franck Ernult, which claims priority of French Application No. 01 13174, filed on Oct. 12, 2001, and which was not published in English, commonly assigned herewith.

TECHNICAL DOMAIN

This invention relates to a magnetoresistive device with a spin valve. This device is used in applications for ultra-high density magnetic recording, as a sensitive element in magnetoresistive read heads for magnetic tapes and for computer hard disks. Another application of this device is for making memory dots and MRAM (Magnetic Random Access Memory) type memories.

STATE OF THE PRIOR ART

In the field of magnetic read heads and magnetic random access memories, magnetoresistive spin valve devices which have a spin valve formed by a stack of layers with a separating layer sandwiched between two magnetic layers were not used until recently. The relative orientation of the magnetisation directions of these layers may vary under the influence of a magnetic field. In some devices, the two magnetic layers have a free magnetisation direction. In this case, the two extreme positions in which the two magnetisation directions are parallel or anti-parallel are used, and also all intermediate positions. In other devices, one of the magnetic layers is free and the other is said to be trapped. The direction of its magnetisation is fixed by an anti-ferromagnetic exchange layer. American U.S. Pat. No. 5,898,548 illustrates such a configuration; in this patent, the separating layer is a fine dielectric barrier forming a tunnel junction.

Means of circulating a current perpendicular to the plane of the layers are attached to the spin valve. They are in the form of an electrode at the vertex and at the base of the spin valve.

Devices also exist in which the current circulates perpendicular to the plane of the layers, and for which their spin valve is fully metallic with a continuous metallic layer 10 sandwiched between two magnetic layers 20, 30, like in American U.S. Pat. No. 5,668,688. This type of device is shown in FIG. 1. The free magnetic layer 30 and the trapped magnetic layer 20 are separated by a continuous separating layer 10 that is electrically conducting and nonmagnetic to enable decoupling between the two magnetic layers 20, 30. The current input electrodes 60a and 60b are shown on each side of the magnetic layers 20, 30.

In this example, the trapped magnetic layer 20 is associated with an anti-ferromagnetic layer 21 that contributes to keeping its magnetisation fixed. It is located between the trapped magnetic layer 20 and the associated electrode 60a. The free magnetic layer 30 is associated with a buffer layer 31 that contributes to promoting growth of all component layers of the spin valve.

These spin valves are often called GMR (Giant MagnetoResistance) devices.

These tunnel junction spin valve magnetoresistive devices, or fully metallic spin valve magnetoresistive devices carrying current perpendicular to the plane of the layers, increase the spatial resolution of the magnetic head along the tracks.

But these devices are not very satisfactory in terms of sensitivity.

The resistance of tunnel junction devices is too high, which introduces a large amount of shot noise. For the shot noise to be acceptable, the product RA that is the product of the resistance of the junction and its surface area must be kept below 5 $\Omega \cdot \mu m^2$.

The resistance of the spin valve varies exponentially with the thickness of the dielectric barrier. In order to obtain a spin valve with an RA product equal to 10 $\Omega \cdot \mu m^2$, the thickness of its barrier must not be more than 0.5 nm, which is very thin. Furthermore, the amplitude of the magnetoresistance of this type of device with a dielectric barrier decreases when an attempt is made to reduce the product RA below about 10 $\Omega \cdot \mu m^2$. Therefore this is not desirable.

Magnetoresistive devices with a fully metallic spin valve have a product RA that is very small, of the order of 1 to 5 $m\Omega \cdot \mu m^2$. The surface areas of this type of spin valve are of the order of a few thousandths to a few hundredths of a square micrometre, for densities of information to be read of the order of 150 to 300 Gbit/inch$^2$, which gives resistances of the order of a few tenths of an ohm. These values are too small compared with the contact resistances with current input electrodes, and the resistances of the electrodes themselves. The resistances of the electrodes and contacts are in series with the resistance of the spin valve, which has the effect of diluting the signal that is to be detected.

In random access memories, the high resistance of the tunnel junction has the disadvantage that it leads to a high memory time constant which limits its operating frequency.

PRESENTATION OF THE INVENTION

This invention is intended to make a spin valve magnetoresistive device that does not have the disadvantages mentioned above. More precisely, an attempt is made to make a magnetoresistive spin valve device with a high magnetoresistance amplitude while having an RA product intermediate to products according to the prior art.

To achieve this, the magnetoresistive device comprises a spin valve formed from a stack of layers including at least two magnetic layers for which the relative orientation of their magnetisation directions can vary under the influence of a magnetic field and means of circulating a current in the spin valve transverse to the plane of the layers. The spin valve comprises at least one discontinuous dielectric or semiconducting layer with electrically conducting bridges passing through the thickness of the dielectric or semiconducting layer, in at least one of the magnetic layers, these bridges being designed to locally concentrate the current that passes transversely through the stack.

In this version, the bridges may be made from the magnetic material of the layer containing the dielectric or semiconducting layer.

A continuous non-magnetic electrically conducting separating layer may be inserted between the dielectric or semiconducting layer with the electrically conducting bridges and at least one of the magnetic layers. It enables magnetic decoupling between the two magnetic layers.

The electrically conducting bridges may be made from a non-magnetic material chosen from among noble metals such as gold, silver, copper or alloys of gold, silver and copper.

In one variant, they may be made from a magnetic material such as cobalt, iron, nickel or alloys of cobalt, iron or nickel.

The dielectric or semiconducting material in the discontinuous layer may be magnetic or non-magnetic. It is not a tunnel junction. Its role is to deviate the current that passes through the stack so that it is concentrated at the bridges.

One of the magnetic layers may have a magnetisation direction fixed by the association of an anti-ferromagnetic layer arranged beyond the magnetic layer with magnetisation direction fixed with respect to the dielectric or semiconducting layer with the electrically conducting bridges.

At least one of the magnetic layers may be formed from a stack of intermediate layers.

In particular, the magnetic layer with a fixed magnetisation direction may be formed from an intermediate electrically conducting non-magnetic layer surrounded by two intermediate magnetic layers.

The discontinuous dielectric or semiconducting layer may be made based on oxide, nitride or a semiconductor.

The means of circulating an electric current may comprise two electrodes that hold the spin valve like in a sandwich.

At least one buffer layer may be inserted between one of the electrodes and the spin valve.

The spin valve may be single or dual.

This invention also relates to a magnetic read head that comprises a magnetoresistive device thus defined.

This invention also relates to a memory comprising a matrix of memory dots, each of the memory dots comprising a magnetoresistive device thus defined.

This invention also relates to a process for making a magnetoresistive device with a spin valve, and comprises the following steps:

manufacture of a stack of layers to form the spin valve, including at least two magnetic layers for which the relative orientation of their magnetisation direction can vary under the effect of a magnetic field, production of means of circulating a current in the spin valve transverse to the plane of the layers, manufacture of at least one discontinuous dielectric or semiconducting layer with electrically conducting bridges passing through the thickness of the layer in one of the magnetic layers, these bridges being designed to locally concentrate the current that passes transversely through the stack.

The dielectric or semiconducting layer with the electrically conducting bridges may be made by the deposition of a thin layer of dielectric or semiconducting material including metallic particles. These metallic particles are grouped to form the bridges.

In one variant, the dielectric or semiconducting layer with the electrically conducting bridges may be made by locally treating an electrically conducting layer in the stack to make it dielectric or semiconducting. The treatment may take place during deposition or at the end of the deposition of the electrically conducting layer.

In another variant, the dielectric or semiconducting layer with the electrically conducting bridges may be made by placing an insulating layer with discontinuities between two electrically conducting layers in the stack and by making the electrically conducting material diffuse through discontinuities in the insulating layer. The discontinuities may exist naturally in the insulating layer or they may be created artificially in the insulating layer.

In another variant, the dielectric or semiconducting layer with the electrically conducting bridges may be made using an electrically conducting material with low wettability, such as silver, so as to obtain a plurality of drops forming bridges when it is deposited, and then depositing an electrically conducting material on top such as aluminium, which is not miscible with the drops so as to fill in the spaces between the drops, and by performing a treatment for the electrically conducting material located between the drops to make it dielectric or semiconducting.

The thickness of the electrically conducting material is slightly less than the thickness of the drops to obtain the transverse bridges.

The electrically conducting material leading to the discontinuous dielectric or semiconducting layer may be deposited on one of the layers of the stack, an electrically conducting material with low wettability creating a plurality of drops being deposited on top of it, and a treatment being carried out to make the electrically conducting material located between the drops dielectric or semiconducting.

An electrically conducting material with low wettability and a non-miscible electrically conducting material may be deposited at the same time on a layer of the stack and treated to make the electrically conducting material dielectric or semiconducting.

An electrically conducting material with low wettability creating a plurality of drops may be deposited on one of the layers in the stack, this layer in the stack being treated so as make it dielectric or semiconducting on the surface and to enable it to cooperate with the drops.

The treatment may be an oxidation or a nitridation.

BRIEF DESCRIPTION OF THE FIGURES

This invention will be better understood after reading the description of exemplary embodiments given for information purposes only and that are in no way restrictive, with reference to the attached drawings on which:

FIG. 10 shows a memory for which each of the memory dots comprises a magnetoresistive device according to the invention;

The various elements are not shown to scale on these Figures, to make them easier to understand.

DETAILED PRESENTATION OF PARTICULAR EMBODIMENTS

Figure 2:
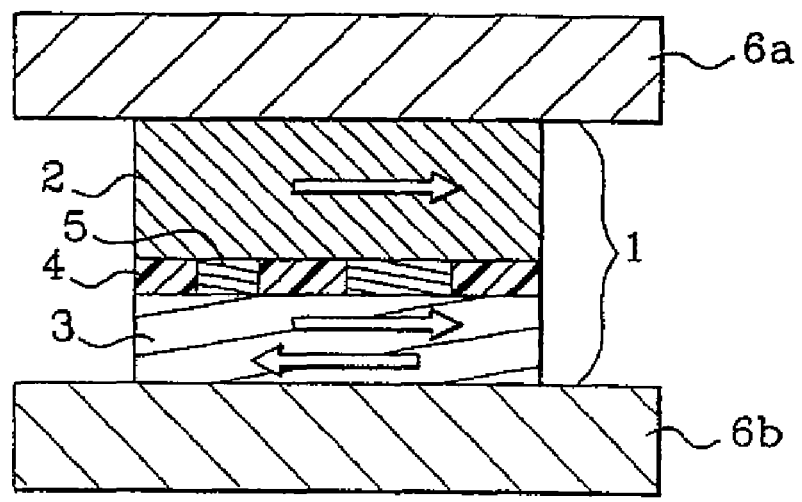
FIG. 2 shows a sectional view of a magnetoresistive device according to the invention with a single spin valve.

FIG. 2 shows an example of a basic configuration of a magnetoresistive spin valve device according to the invention. As we have already seen, a spin valve with a perpendicular current comprises at least two magnetic layers for which the relative orientation of their magnetisation directions can vary under the effect of a magnetic field. At least one of the magnetic layers has a free magnetisation direction. To simplify the diagrams and descriptions, the examples shown in the following part of this description apply to a structure for which one of the magnetic layers has a free magnetisation direction and the other has a fixed magnetisation direction. The directions of magnetisation could have been free for the two magnetic layers, and it would be easy to adapt one of the structures to the other.

The device in FIG. 2 comprises a spin valve 1 that is a stack of layers with magnetic layers 2, 3, at least one of which is a so-called trapped magnetic layer 2 and at least one of which is a so-called free magnetic layer 3 within the stack 1, at least one dielectric or semiconducting layer 4 through which electrically conducting bridges 5 pass oriented transverse to the plane of the magnetic layers 2, 3. It is preferable that the dielectric or semiconducting layer 4, that is discontinuous due to the presence of the bridges 5, is located at the interface between the two magnetic layers 2, 3.

The so-called trapped magnetic layer 2 (a single arrow) is magnetised in a fixed direction. The direction of magnetisation of the so-called free magnetic layer 3 (two opposite arrows) can be determined freely within a magnetic field in which it is immersed and that is to be detected in the magnetic read heads application. The relative variation in the orientation of the direction of magnetisation of the two magnetic layers 2, 3 causes a change in the electrical resistance of the spin valve. The magnetoresistive device also includes means 6a, 6b of circulating an electric current in the spin valve through the stack 1, these means possibly including two electrodes 6a, 6b that bound the spin valve 1. The electrodes 6a, 6b are also used for taking the voltage in order to measure the resistance variation. The magnetic layers 2, 3 then conduct electricity.

The conducting bridges 5 associated with the dielectric or semiconducting layer 4 perform the function of concentrating the current circulating in the stack 1. They electrically connect the two magnetic layers 2, 3. For the duration of the crossing, they keep the spin of electrons that pass through them. The spin distribution length is greater than the distance separating the two layers.

The main purpose of the discontinuous dielectric or semiconducting layer 4 is to provide local electrical insulation between the two electrically conducting magnetic layers 2, 3. It can also act as a magnetic insulation between the two magnetic layers 2, 3 and in this case it is non-magnetic. Its thickness may be of the order of 0.2 to 5 nm.

Figure 3:
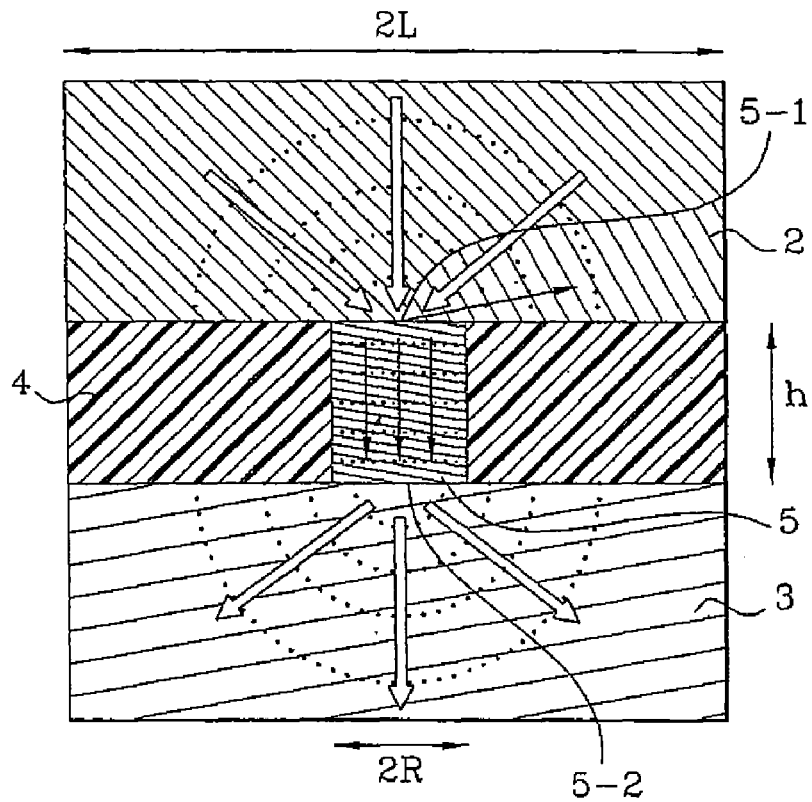
FIG. 3 shows a part of the magnetoresistive device in FIG. 2 in order to explain its operation.

The principle for obtaining a high resistance value while maintaining a high magnetoresistance amplitude compared with devices according to the prior art, is shown in FIG. 3 that shows a partial detail of the spin valve of the device shown in FIG. 2.

Figure 1:
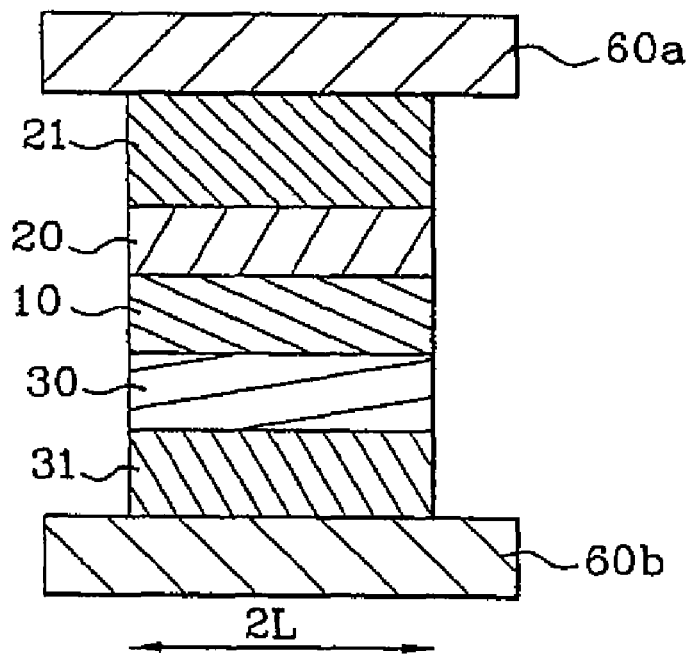
FIG. 1 (already described) shows a section through a magnetoresistive device according to the prior art.
Figure 4:
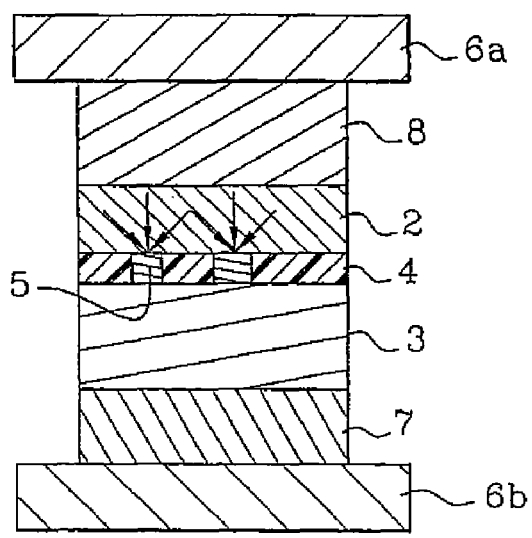
FIG. 4 shows a sectional view of another example of a magnetoresistive device according to the invention.

FIG. 4, which will also be referred to, shows an example of a device according to the invention that will be used to make a comparison with the conventional device shown in FIG. 1. As shown in FIG. 1, a buffer layer 7 and an anti-ferromagnetic layer 8 have been added in FIG. 4. The buffer layer 7 may for example be made from tantalum or an NiFeCr alloy. The anti-ferromagnetic layer may be made based on manganese, for example based on PtMn, PdPtMn, PtMnCr, IrMn, FeMn, NiMn, RuRhMn.

The current that circulates perpendicular to the magnetic layers 2, 3 is concentrated at the electrically conducting bridges 5. These bridges 5 are small, and can be compared with current wells and point sources. These bridges 5 may have a diameter of a few nanometres if the surface area of the spin valve is a few hundredths of a $\mu m^2$. The current lines that are initiated in the magnetic layers 2, 3 and pass through the conducting bridges 5 are shown in solid lines.

The iso-potential lines in magnetic layers 2, 3 illustrated by dashed lines are in the form of concentric half-spheres, for which the equator is located at the dielectric or semiconducting layer 4 through which the electrically conducting bridges 5 pass.

If the current circulating in the spin valve is equal to I, the current density at a distance r from a first end 5-1 of one of the bridges 5 is equal to:

$$J=I/2\pi \cdot r^2$$

and the local electrical field is equal to:

$$E=\rho_F \cdot J$$

$E=\rho_F \cdot I/2\pi r^2$ where $\rho_F$ is the resistivity of the magnetic material in the magnetic layer 2 adjacent to the first end 5-1 of the bridge 5.

The potential difference between a part very remote from the first end 5-1 of the bridge 5, for example the electrode 6a that is located beyond the magnetic layer 2 that is adjacent to the first end 5-1 of the bridge 5, is equal to:

$V_\infty - V_{5-1} = \rho_F \cdot I/2\pi \cdot R$ where R is the radius of the bridge 5 that is assumed to be cylindrical in the example.

The current lines inside the bridge 5 are parallel to the axis of the cylinder. The potential difference between the two ends 5-1, 5-2 of the bridge 5 is given by:

$V_{5-1} - V_{5-2} = \rho_P \cdot h \cdot I/\pi \cdot R^2$ where $\rho_P$ is the resistivity of the bridge 5 and h is the height of the bridge 5.

In the same way, the potential difference between the second end 5-2 of the bridge 5 and a part very remote from this end, for example the electrode 6b that is located beyond the magnetic layer 3 that is adjacent to the second end 5-2 of the bridge 5, is given by:

$V_{5-2} - V_{-\infty} = \rho_{F'} \cdot I/2\pi \cdot R$ where $\rho_{F'}$ is the resistivity of the magnetic material in the magnetic layer 3 adjacent to the second end 5-2 of the bridge 5.

The potential difference between the two electrodes 6a, 6b that surround the spin valve is given by:

$$V_\infty - V_{-\infty} = (\rho_F \cdot I/2\pi \cdot R) + (\rho_P \cdot h \cdot I/\pi \cdot R^2) + (\rho_{F'} \cdot I/2\pi \cdot R)$$

The resistance between the two electrodes 6a, 6b is given by:

$$R_{CPP} = (V_\infty - V_{-\infty})/I$$

$$R_{CPP} = (\rho_F/2\pi \cdot R) + (\rho_P \cdot h/\pi \cdot R^2) + (\rho_{F'}/2\pi \cdot R)$$

In comparison, the resistance in a fully metallic conventional spin valve like that shown in FIG. 1, in which the layer separating the magnetic layers is a non-magnetic electrically conducting layer with the same resistivity as the resistivity of the bridge material ($\rho_P$), will be given by:

$R_{CPP'} = (\rho_F \cdot e/\pi \cdot L^2) + (\rho_P \cdot l/\pi \cdot L^2) + (\rho_{F'} \cdot e'/2\pi \cdot L^2)$ where e and e' are the thicknesses of the magnetic layers 20, 30, l is the thickness of the separating layer 10, and L is the radius of the spin valve that is assumed to be cylindrical.

The increase in the resistance related to replacement of the separating layer 10 by the discontinuous dielectric or semiconducting layer 4 with the electrically conducting bridges 5 is of the order of:

$R_{CPP}/R_{CPP'} \approx L^2/e \cdot R$ assuming that e, l and e' are approximately the same.

For example, for a thickness of the magnetic layer e of the order of 10 nm, a radius L of the spin valve of the order of 100 nm, a radius R of the bridge 5 of the order of 2 nm, an increase in the resistance of the order of 500 can be obtained which means that the product RA can reach levels of the order of 1 $\Omega \cdot \mu m^2$, which is quite satisfactory.

The resistance of bridge 5 with the dimensions mentioned above is of the order of 30Ω.

The amplitude of the magnetoresistance is higher in the example in FIG. 4 than in the example in FIG. 1. The current density and therefore the voltage variation is a maximum at the separation between the magnetic layers, at the electrically conducting bridges 5, but this is the area in which the magnetoresistance is initiated. If the stack also includes other layers such as the buffer layer 7 and the anti-ferromagnetic layer 8, the addition of these layers in series only very slightly reduces the magnetoresistance effect since the voltage at the boundaries of these layers will be low, and a low current density will pass through them. On the contrary in the example in FIG. 1, the current lines remain perpendicular to the interfaces and the magnetoresistance is strongly reduced by the addition of these additional layers. The resistance of these layers is added to the resistance of the magnetic layers, which has the effect of diluting the magnetoresistance and reducing the amplitude. The following tables show an estimate of the gain in the effective magnetoresistance resulting from the elimination of this dilution by constriction of current lines due to the presence of electrically conducting bridges:

Example for FIG. 1

| | Resistivity $\rho$ in $\mu \cdot \Omega \cdot cm$ | Thickness e in nm | Resistance Rc in Ω |
|---|---|---|---|
| layer 21 | 150 | 15 | 2.25 |
| layer 20 | 20 | 3 | 0.06 |
| layer 10 | 5 | 2 | 0.01 |
| layer 30 | 20 | 5 | 0.1 |
| layer 31 | 80 | 5 | 0.4 |

Example for FIG. 4

| | Resistivity $\rho$ in $\mu \cdot \Omega \cdot cm$ | Thickness e in nm | Resistance $R_C$ in Ω |
|---|---|---|---|
| layer 8 | ≈150 | 15 | 2.25 |
| layer 2 | ≈20 | 3 | ≈15 |
| layer 4 + 5 | ≈5 | 2 | 8 |
| layer 3 | ≈20 | 5 | 15 |
| layer 7 | ≈80 | 5 | 0.4 |

| | Example in FIG. 1 | Example in FIG. 4 |
|---|---|---|
| $R_u$: resistance of the useful part for the magnetoresistance | 0.17Ω | 38Ω |
| $R_T$: total resistance | 2.82Ω | 41Ω |
| Intrinsic magnetoresistance = $R_u/R_T$ | 0.06Ω | 0.92Ω |
| Effective magnetoresistance = 40% of the intrinsic magnetoresistance | 2.4% | 37% |

This gain can be as high as at least 10. The resistances obtained can be adjusted by varying the size and density of the electrically conducting bridges and may for example be within the range 0.1 $\Omega \cdot \mu m^2$ to 1 $\Omega \cdot \mu m^2$.

The bridges 5 may be made from a non-magnetic metal, possibly a noble metal chosen from the group consisting of gold, silver, copper and their alloys.

In the example in FIG. 4, the discontinuous dielectric or semiconducting layer 4 is non-magnetic.

The layer 4 may be made based on oxide, for example such as alumina, zirconia, strontium titanate ($SrTiO_3$), magnesium oxide, cobalt oxide, nickel oxide, iron oxide ($Fe_2O_3$) and/or a nitride such as aluminium nitride or a semiconducting material such as germanium, silicon, gallium arsenide. Oxides and nitrides have better magnetoresistive properties than semiconducting materials.

In one variant, the bridges 5 may be made from a magnetic electrically conducting material for example such as cobalt. This material may be different from the material used in the magnetic layers 2, 3. The difference from the previous situation in which the bridges are made from a non-magnetic material is that there is magnetic coupling between the two magnetic layers 2, 3. When the magnetisations of the two layers 2, 3 are anti-parallel, a wall parallel to the plane of the layers will be formed and will remain confined within the magnetic bridges 5, and separates areas with opposite magnetisation directions.

Figure 5A:
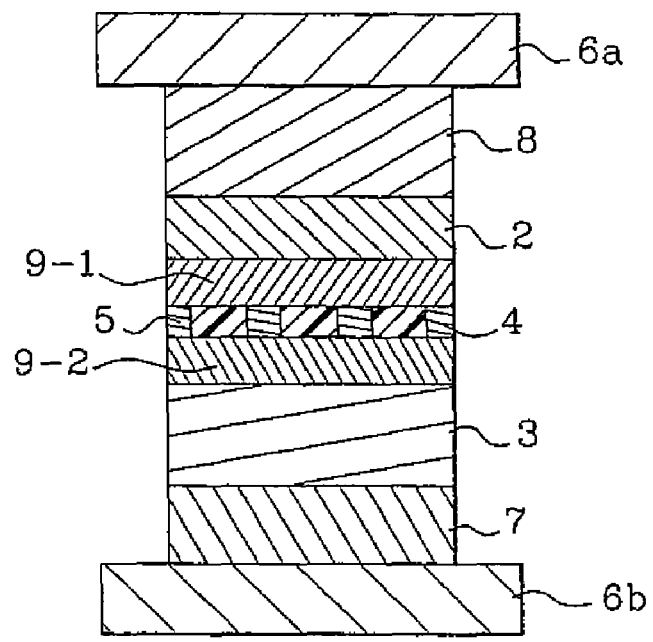
FIGS. 5A, 5B and 5C show other examples of magnetoresistive devices according to the invention.

It is possible to insert at least one continuous non-magnetic electrically conducting separating layer 9-1, 9-2 between the dielectric or semiconducting layer 4 with its electrically conducting bridges 5 and the magnetic layers 2, 3 to achieve magnetic decoupling. FIG. 5A shows this configuration, and the two magnetic layers 2, 3 sandwich a stack formed of two electrically conducting separating layers 9-1, 9-2 surrounding a dielectric or semiconducting layer 4 with electrically conducting bridges 5.

The dielectric or semiconducting material from which the discontinuous layer 4 is made may be magnetic, for example it may be made of cobalt oxide or a cobalt iron oxide or a ferromagnetic spinel $Fe_3O_4$. It may also be non-magnetic, for example such as $Al_2O_3$, $SiO_2$, $HfO_2$, $Ta_2O_5$.

With the structure in FIG. 5A, it would have been possible for the electrically conducting material of the bridges 5 to be the same as the material for the separating layers 9-1, 9-2, it could have diffused through the discontinuities in the layer 4 made of a dielectric material.

Figure 5B:
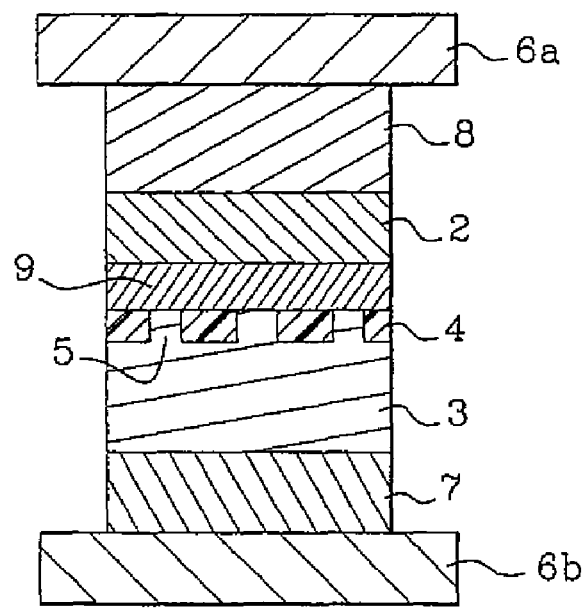

It is also possible that the bridge material 5 could be the material used for one of the magnetic layers 2, 3. Refer to FIG. 5B that shows this special case. In this case, the dielectric or semiconducting layer could be placed with its electrically conducting bridges inside one of the magnetic layers. In FIG. 5B, it is very slightly inside the free magnetic layer 3, and is on the same side as the other magnetic layer 2.

The two magnetic layers 2, 3 are separated by at least one continuous separating layer 9 made of a non-magnetic electrically conducting material, for example copper. This means that the dielectric or semiconducting layer 4 with electrically conducting bridges 5 is at the interface between the magnetic layer 3 that holds it and the separating layer 9.

Figure 5C:
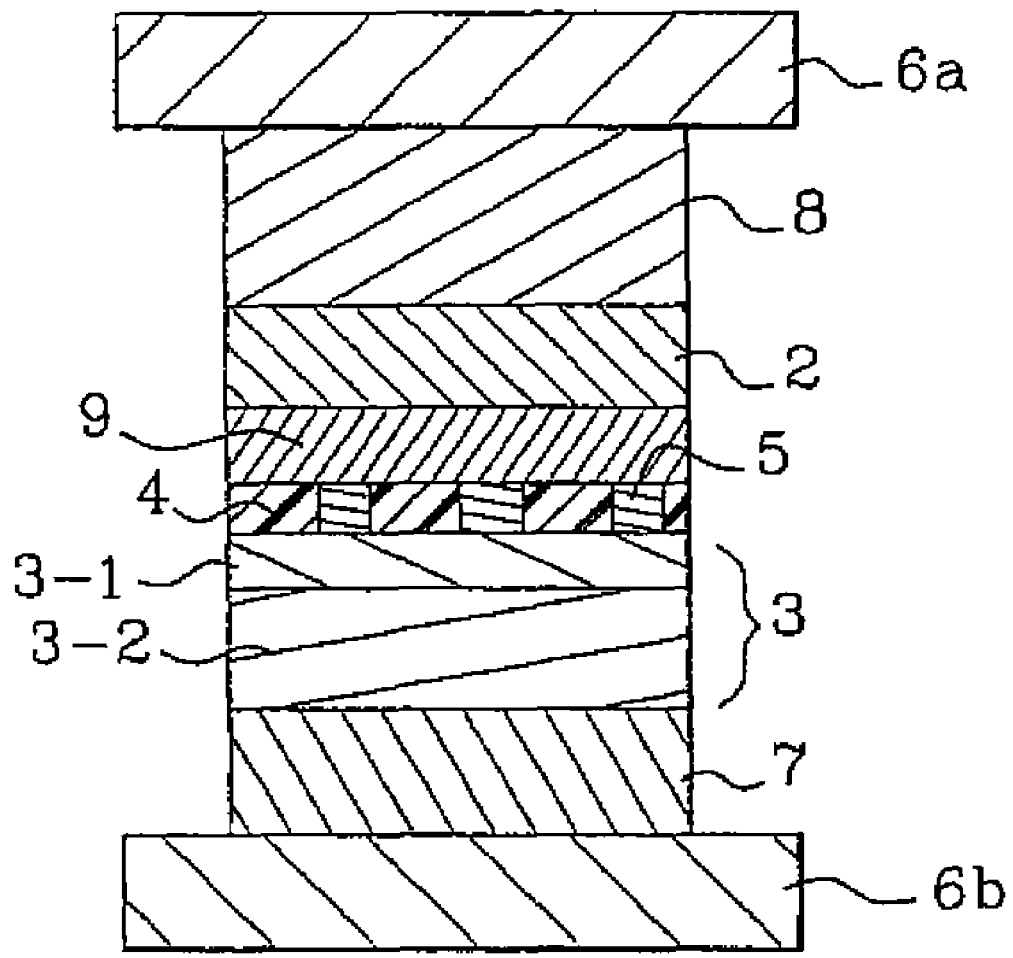

It is possible that one of the magnetic layers is formed by a stack of several intermediate layers. In FIG. 5C, this is the free magnetic layer 3. The intermediate layers 3-1, 3-2 made of different materials increase the giant magnetoresistance amplitude by increasing the diffusion contrast dependent on the spin and reducing magnetic fluctuations at interfaces at ambient temperature. One of the so-called sensitive intermediate layers 3-2 may for example be made of Ni80Fe20, and the other 3-1 called the intermediate magnetic interface doping layer closest to the trapped magnetic layer 2, may for example be made of Co90Fe10. The discontinuous dielectric layer 4 with electrically conducting bridges 5 is at the interface between the interface doping layer 3-1 and the other magnetic layer 2, but it may also be included in the interface doping layer 3-1. In general, the discontinuous dielectric or semiconducting layer 4 is advantageously placed as close as possible to the other magnetic layer 2.

In this example, a magnetic separating layer 9 is also inserted between the discontinuous dielectric or semiconducting layer 4 with electrically conducting bridges and the other magnetic layer 2. It is assumed that the layer 4 is magnetic.

Figure 8:
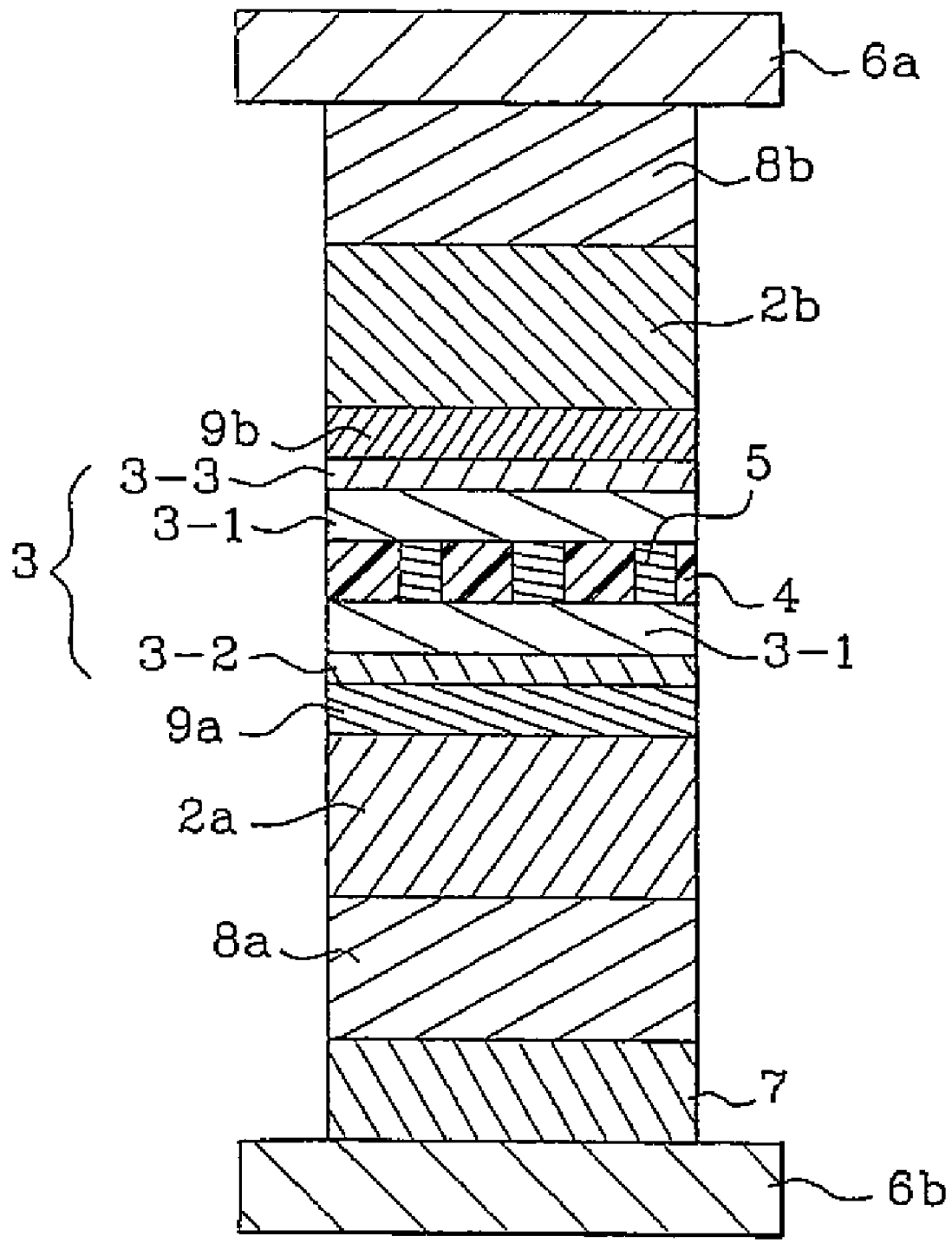

In FIG. 8, that shows a variant of a device according to the invention with a pair of spin valves in series, the dielectric or semiconducting layer with its electrically conducting bridges is located within the free magnetic layer and no longer at the surface.

Figure 6:
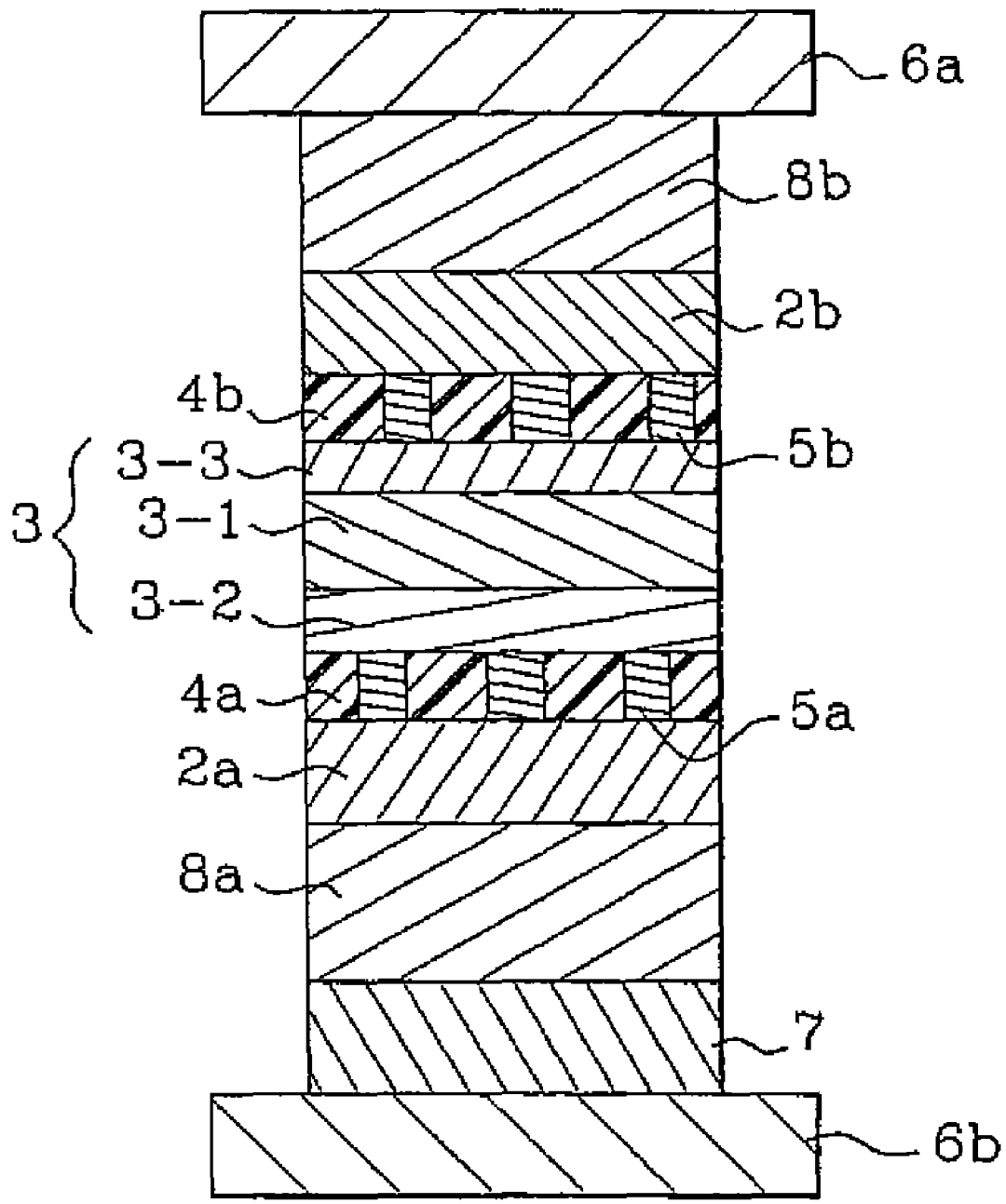
FIGS. 6 to 8 show several variants of magnetoresistive devices according to the invention with dual spin valve.
Figure 7:
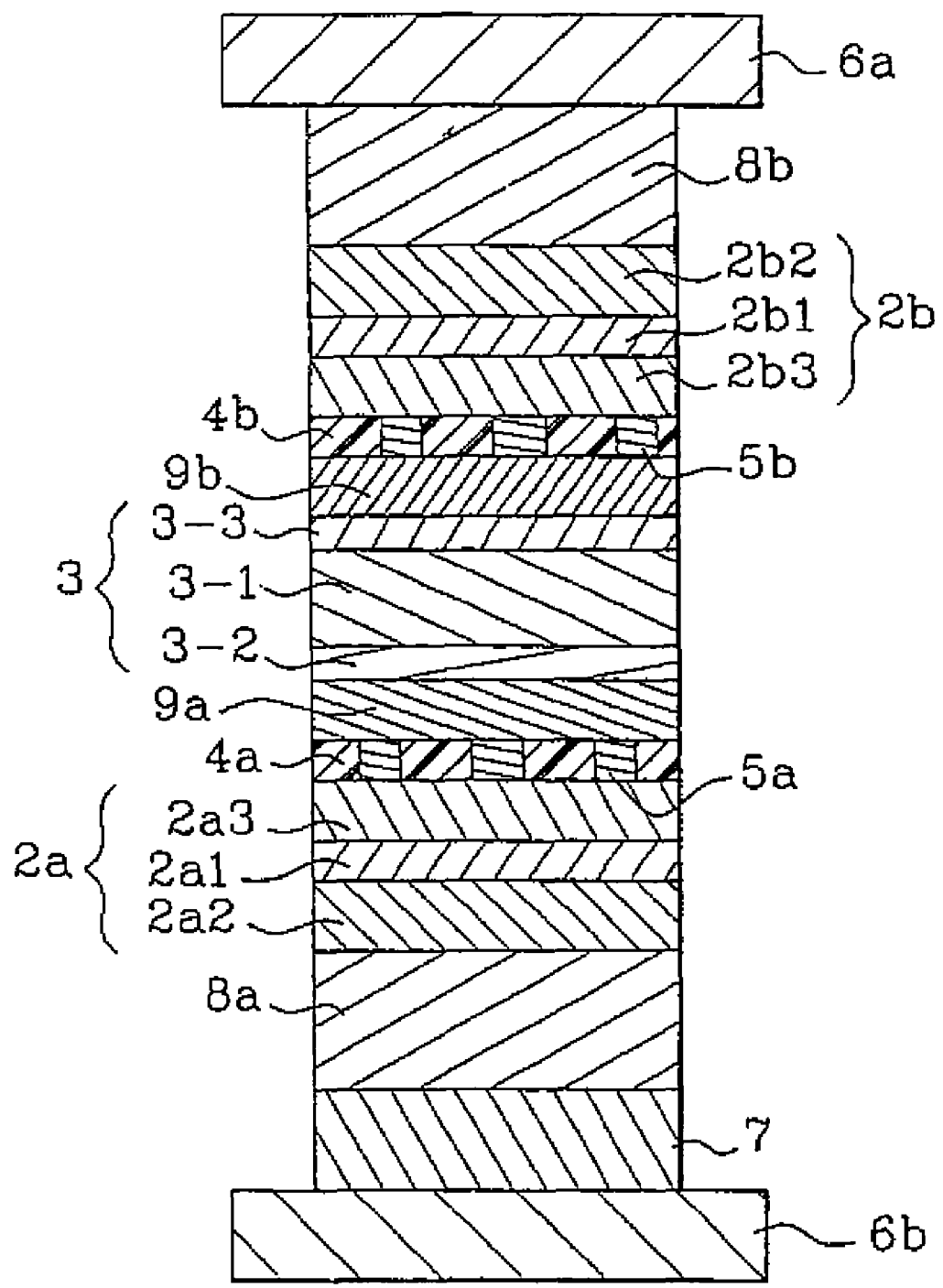

However, it is preferable to put the dielectric or semiconducting layer 4 with its electrically conducting bridges 5 on the same side as the trapped magnetic layer 2 so as not to reduce the strong susceptibility necessary for the free magnetic layer 3. This configuration is shown in FIGS. 6 and 7 that also show devices according to the invention with a pair of spin valves in series.

The dielectric or semiconducting layer 4 is placed with its electrically conducting bridges 5 as close as possible to the interface between the magnetic layers 2, 3 otherwise the current concentration effect at the magnetoresistance source would be smaller and the amplitude of the magnetoresistance would also be smaller.

The trapped magnetic layer 2a, 2b may be formed from a stack of three intermediate layers. It can be done as shown in FIG. 7, with two trapped magnetic intermediate layers (2a2, 2a3), (2b2, 2b3) sandwiching a non-magnetic electrically conducting intermediate layer 2a1, 2b1. For example a CoFe/Ru/CoFe stack could be used. Materials other than ruthenium could be used, such as Ir, Rh, Re.

The thickness of the central intermediate layer 2a1, 2b1 may be between 0.3 and 1 nm. The result is thus a so-called synthetic trapped layer. A synthetic trapped layer of this type increases the trapping field and reinforces its magnetic stability.

We will now consider several examples of magnetoresistive devices with a pair of spin valves in series, this structure being known as a dual spin valve. This type of dual spin valve may comprise the following in sequence: a central free magnetic layer 3 and two trapped magnetic layers 2a, 2b on each side of the free magnetic layer 3. The stack corresponding to the dual spin valve in FIG. 6 comprises a buffer layer 7 above one of the electrodes 6b called the base electrode 6b, a first anti-ferromagnetic trapping layer 8a, a first trapped layer 2a, a first discontinuous dielectric or semiconducting layer 4a with electrically conducting bridges 5a, a free magnetic layer 3, a second discontinuous dielectric or semiconducting layer 4b with electrically conducting bridges 5b, a second trapped magnetic layer 2b, a second anti-ferromagnetic trapping layer 8b, and finally the second so-called vertex electrode 6a. In this configuration, the two discontinuous dielectric or semiconducting layers 4a, 4b with the electrically conducting bridges 5a, 5b have the same structure as in FIG. 4. The free magnetic layer 3 is formed from a stack of intermediate layers with two intermediate magnetic interface doping layers 3-2, 3-3, sandwiching an actual free magnetic intermediate layer 3-1.

We will now consider FIG. 7. The stack corresponding to the dual spin valve in FIG. 7 comprises a buffer layer 7 above one of the so-called base electrodes 6b, a first anti-ferromagnetic trapping layer 8a, a first synthetic trapped layer 2a, a first discontinuous dielectric or semiconducting layer 4a with electrically conducting bridges 5a, a first non-magnetic electrically conducting separating layer 9a, a free magnetic layer 3, a second non-magnetic electrically conducting separating layer 9b, a second discontinuous dielectric or semiconducting layer 4b with electrically conducting bridges 5b, a second synthetic trapped layer 2b, a second anti-ferromagnetic trapping layer 8b and finally the second so-called vertex electrode 6a.

In this configuration, each of the trapped layers 2a, 2b is synthetic and is formed from a stack of intermediate layers with an electrically conducting non-magnetic intermediate layer 2a1, 2b1 sandwiched between two magnetic trapping layers (2a2, 2a3), (2b2, 2b3).

The free layer 3 is similar to the layer shown in FIG. 6 with two intermediate magnetic interface doping layers 3-2, 3-3 sandwiching a real free magnetic intermediate layer 3-1.

We will now refer to FIG. 8. The stack corresponding to the dual spin valve in FIG. 8 comprises a buffer layer 7 above one of the so-called base electrodes 6b, a first anti-ferromagnetic trapping layer 8a, a first trapped layer 2a, a first separating layer 9a made of a non-magnetic electrically conducting material, a free magnetic layer 3 including the discontinuous dielectric or semiconducting layer 4 with electrically conducting bridges 5, a second non-magnetic electrically conducting separating layer 9b, a second trapped layer 2b, a second anti-ferromagnetic trapping layer 8b and finally the second so-called vertex electrode 6a.

Figure 9:
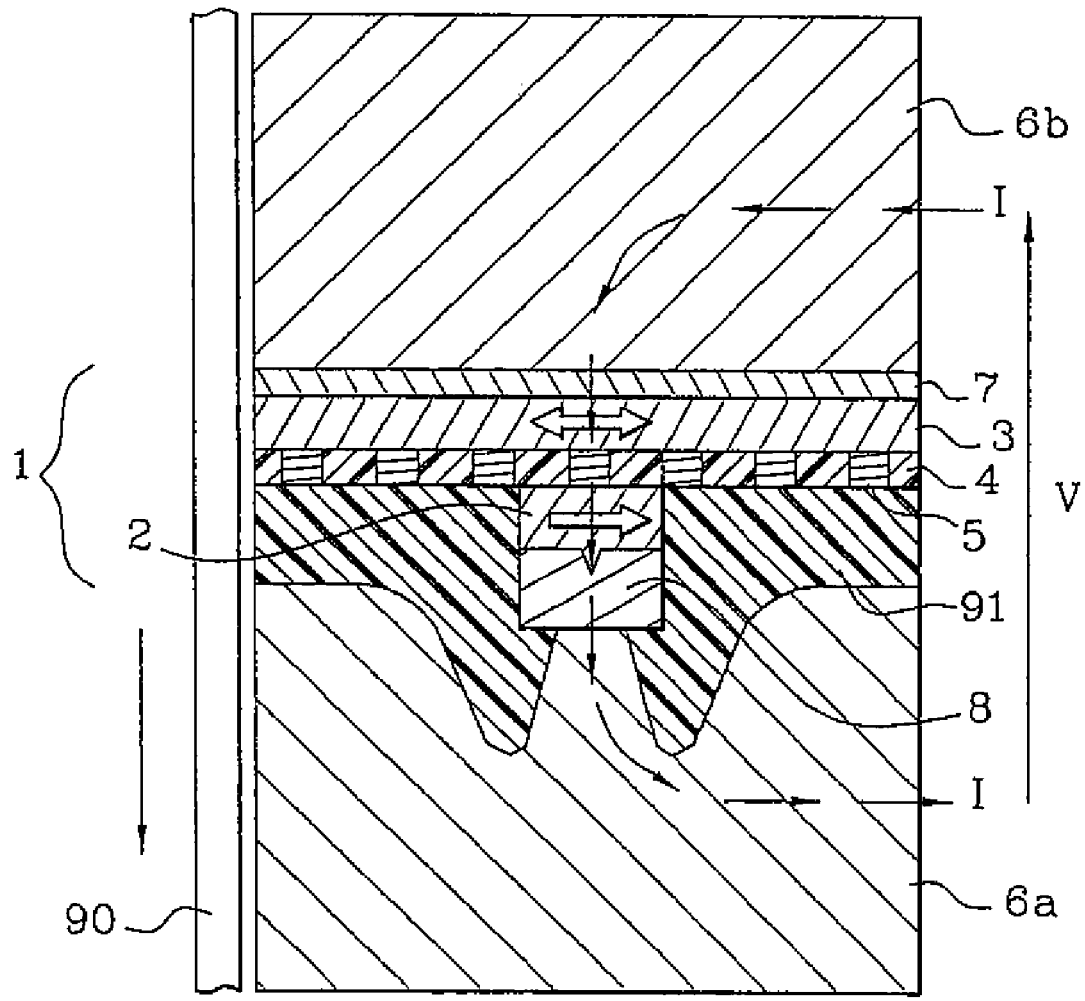
FIG. 9 shows a magnetic read head containing a magnetoresistive device according to the invention.

FIG. 9 shows an example of a magnetic head according to the invention including a magnetoresistive device as described with a spin valve. The electrodes 6a, 6b bringing in the current I and for taking the voltage V are used as magnetic screens. The spin valve 1 is positioned close to a mobile magnetic support 90, data in the form of bits to be read being recorded on this support. The magnetic screens enable the spin valve to detect individual magnetic transitions between two successive bits, without interference with neighbouring transitions. The surface area of the trapped magnetic layer 2 and the anti-ferromagnetic trapping layer 8 is smaller than the surface area of the dielectric layer 4 with the electrically conducting bridges 5, and facing it. They are coated with a dielectric material 91 that extends along the discontinuous layer 4 with the electrically conducting bridges 5. This structure keeps the area in which the current is passing away from the surface of the magnetic support 90.

FIG. 10 shows a memory according to the invention. It comprises a matrix of memory dots addressable by rows and columns. Each memory dot comprises a device 101 according to the invention, illustrated by a resistance in series with a switching means 102 in the form of a transistor. Each device according to the invention is connected to an addressing line 103 and the switching means is connected to an addressing column 105. The addressing rows 103 are connected to the outputs from a row addressing circuit 104, and the addressing columns 105 are connected to the outputs from a column addressing circuit 106.

We will now consider a process for making a dielectric or semiconducting layer with electrically conducting bridges, these bridges being transverse to the plane of the layer. This type of layer is like that shown with references 4, 5 in FIGS. 2 to 8.

Figure 11A:
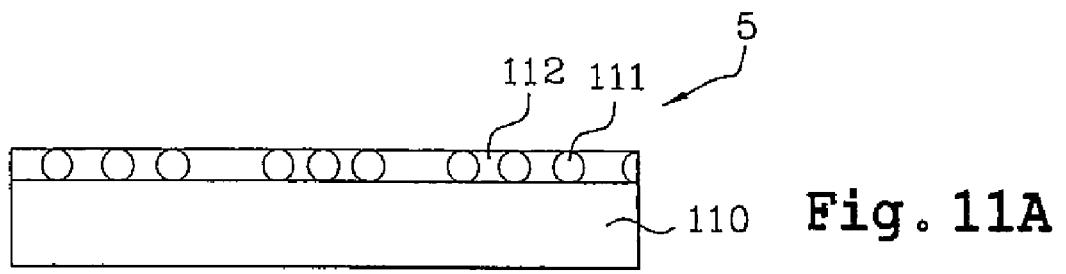
FIGS. 11A to 11C show embodiments of discontinuous dielectric layers with electrically conducting bridges passing through them.
Figure 11B:
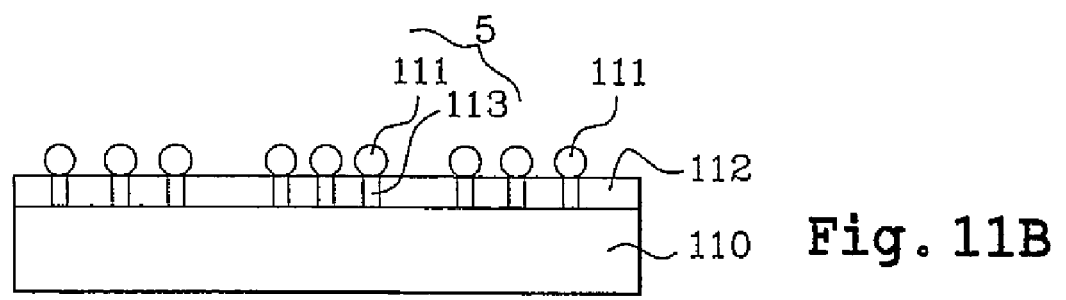
Figure 11C:
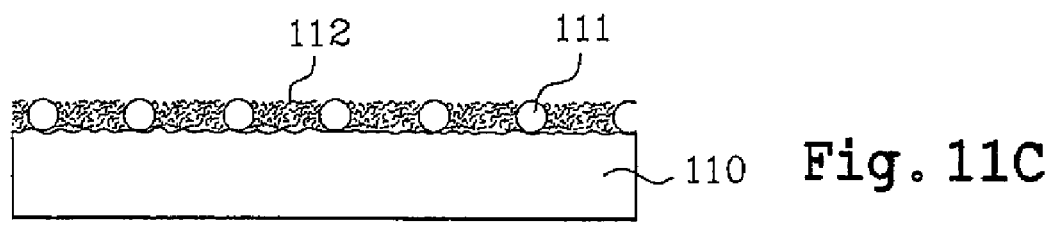

Refer to FIG. 11A. Starting from a support 110, the bridges are made from an electrically conducting material that, as a thin layer, has low wettability on the surface of the support 110. The support may be made of a magnetic material such as NiFe, Co, CoFe, particularly in the case in which magnetoresistive devices are made. When this material is deposited on the surface of the support, it forms groups of a large number of small drops 111. Remember that a wetting thin layer spreads over a solid by occupying the largest possible surface area. On the other hand, a thin layer with low wettability will occupy a small surface area on the surface of the solid. This is the property that is used to make the bridges.

All that is necessary is to associate this material with low wettability with the dielectric or semiconducting material 112 that forms the discontinuous layer.

The material used to make the bridges may be silver deposited in the form of a thin layer, for example by physical vapour deposition (PVD). Silver is not very wetting at ambient temperature and is even less wetting when hot. Silver drops 111 with a diameter of about 1 to 2 nm can be formed by depositing a very thin layer of silver of the order of 0.2 nm thick on the surface of the support 110. Materials other than silver could be used, for example copper or gold, but this low wettability effect is less pronounced.

A conducting material that is non-miscible with the silver drops 111 can be deposited, having been treated to make it dielectric or semiconducting in order to make the discontinuous dielectric or semiconducting layer 112, this treatment having practically no influence on the silver drops.

In this respect, it will be possible to deposit aluminium by PVD, for example, with a thickness less than the thickness of the silver drops 111. The aluminium will fill in the spaces around the silver drops 111. After a treatment such as oxidation or nitridation, the aluminium will be transformed into alumina or aluminium nitride and will become dielectric. The oxidation may be natural oxidation, oxidation by oxygen plasma, by atomic oxygen source, etc. Since aluminium is easily oxidizable while silver is not since it is a noble metal, only the aluminium will be oxidised into alumina. The result is an approximately 2 nm thick alumina layer 112 with bridges 111.

Another magnetic layer can then be deposited on top of it, if it is desired to make a magnetoresistive device according to the invention.

Instead of starting by depositing the silver drops 111 on the support 110, it is possible to start by depositing a thin layer of a material that will lead to the discontinuous dielectric or semiconducting layer 112. For example, an aluminium layer could be deposited, followed by the silver drops 111 on the thin aluminium layer. By performing a surface oxidation, the aluminium located around the drops will be transformed into alumina 112, the aluminium 113 being located under the silver drops 111 is not oxidised or is only slightly oxidised since it is protected. A bridge 5 is then formed consisting of a silver drop 111 and the aluminium 113 located under the drop 111. The alumina surface 112 might be rougher than in the previous case.

Another variant is to co-deposit the material leading to the dielectric or semiconducting layer with the electrically conducting material forming the drops. This leads to a heterogeneous alloy. When it is deposited on the surface of the support 110, drops are formed on the surface of the support, the two co-deposited materials not being miscible. For example, a surface oxidation or nitridation treatment can be done to make the dielectric or semiconducting layer 112 form around the drops 111 that are assumed to be made of silver.

Another method is to deposit the electrically conducting material with low wettability directly onto a support 110, and this is the support that will be treated to be made dielectric or semiconducting on the surface and to make the layer discontinuous. In the example of the magnetoresistive device according to the invention, the support 110 may be magnetic and made of Co or CoFe. It may be the intermediate magnetic interface doping layer described in FIG. 5B. By oxidising this intermediate layer directly, the result is an extent of CoO or CoFeO oxide that cooperates with the drops 111. When the surface of the support 110 is oxidised, it becomes slightly thicker between the silver drops.

In order to make a device according to the invention with at least one spin valve, the layers of the stack will be deposited one after the other. Any deposition techniques known to a person skilled in the art may be used to make magnetic layers formed from a stack of intermediate layers or without any intermediate layers, with separating layers if any, the buffer layer, one or more anti-ferromagnetic layers. In particular, cathodic sputtering, deposition by ion beam, molecular jet epitaxy or even electroplating techniques may be used. The most critical part is to create the discontinuous dielectric or semiconducting layer with electrically conducting bridges.

Obviously, any of the previously described methods can be used to make the discontinuous dielectric layer with the electrically conducting bridges, but other methods are also possible.

A thin layer made of a dielectric or semiconducting material, for example alumina or silica containing solid, non-magnetic metallic particles (for example in the group of noble metals such as silver, gold, copper or their alloys) or magnetic materials such as cobalt or its alloys, can be used. By heating the support on which the thin layer is deposited, atomic mobility of metallic particles is given priority because they regroup to form the electrically conducting bridges. One or more annealings can also be made to obtain the required bridges. In this case, the support on which the thin layer is placed will be either one of the magnetic layers, or a separating layer.

The thin dielectric layer may be deposited by PVD from a dielectric material target or by reactive sputtering of a target made of a metallic material under an oxidising atmosphere.

The solid particles may also be deposited directly in the form of aggregates or metallic clusters from a source of noble metal aggregates.

Another method may be to locally oxidise a layer of an electrically conducting material to make it locally dielectric. The non-oxidised locations form electrically conducting bridges. This layer may be one of the magnetic layers or it may be a separating layer or it may be a layer deposited for this purpose. Oxidation may be done after the layer has been deposited or while it is being deposited. This is achieved by interrupting the deposit, carrying out the oxidation and then resuming the deposit.

Another method uses the fact that when an oxide layer with discontinuities is sandwiched between two metallic layers, metal diffuses through the discontinuities. These discontinuities are defects or grain boundaries. The oxide layer may comprise discontinuities naturally, and this is the case particularly for an ultra-thin layer of nano-crystallised oxides, for example such as magnesium oxides (MgO), hafnium oxide ($HfO_2$), tantalum oxide ($Ta_2O_5$), cobalt oxide (CoO), nickel oxide (NiO) and copper oxide (CuO). All that is necessary is to deposit the oxides layer on a metallic support, which may be one of the magnetic layers 2, 3, one of the intermediate magnetic layers 3-1, 3-2, or a non-magnetic electrically conducting separating layer 9. The deposition may be made from an oxide target or by reactive sputtering or by depositing a metallic layer and then oxidising it afterwards. It is covered by a metallic layer, which may be one of the magnetic layers 2, 3, one of the intermediate magnetic layers 3-1, 3-2 or a non-magnetic electrically conducting separating layer 9. The electrically conducting bridges are then formed naturally.

Discontinuities in the oxide layer may be created by microelectronic techniques instead of being natural, for example using a focused ion beam.

Although several embodiments of this invention have been illustrated and described in detail, it will be understood that various changes and modifications can be made without going outside the scope of this invention.

What is claimed is:

1. Magnetoresistive device comprising:
   a spin valve formed from a stack of layers including at least two magnetic layers for which a relative orientation of their magnetisation directions are capable varying under influence of a magnetic field;
   at least one discontinuous dielectric or semiconducting layer with electrically conducting bridges at least partially passing through a thickness of the dielectric or semiconducting layer, the bridges configured to locally concentrate current that passes transversely through the stack; and
   means for circulating a current in the spin valve transverse to the plane of the layers, characterised in that the dielectric or semiconducting layer with electrically conducting bridges is arranged inside one of the magnetic layers.

2. Magnetoresistive device according to claim 1, further comprising a continuous non-magnetic electrically conducting separating layer inserted between the dielectric or semiconducting layer and at least one of the magnetic layers.

3. Magnetoresistive device according to claim 1, characterized in that the bridges are made from the material of the magnetic layer in which the dielectric or semiconducting layer is located.

4. Magnetoresistive device according to claim 1, characterized in that the electrically conducting bridges are made from a magnetic material such as cobalt, iron, nickel or alloys of cobalt, iron or nickel.

5. Magnetoresistive device according to claim 1, characterized in that the dielectric or semiconducting material in the discontinuous layer is magnetic.

6. Magnetoresistive device according to claim 1, characterized in that the dielectric or semiconducting material in the discontinuous layer is non-magnetic.

7. Magnetoresistive device according to claim 1, characterized in that at least one of the magnetic layers is formed from a stack of intermediate layers.

8. Magnetoresistive device according to claim 1, characterized in that one of the magnetic layers has a magnetization direction fixed by the association of an anti-ferromagnetic layer arranged beyond the magnetic layer with the magnetization direction fixed with respect to the dielectric or semiconducting layer with the electrically conducting bridges.

9. Magnetoresistive device according to claim 8, characterized in that the magnetic layer with the fixed magnetisation direction is formed from an intermediate electrically conducting non-magnetic layer between two intermediate magnetic layers ($2a2$, $2a3$).

10. Magnetoresistive device according to claim 1, characterized in that the discontinuous dielectric or semiconducting layer is made based on an oxide, nitride or a semiconductor.

11. Magnetoresistive device according to claim 1, characterized in that the means fir circulating an electric current comprises two electrodes on opposed ends of the spin valve.

12. Magnetoresistive device according to claim 11, characterized in that at least one buffer layer is inserted between one of the electrodes and the spin valve.

13. Magnetoresistive device according to claim 1, characterized in that the spin valve is a dual spin valve.

14. Magnetoresistive device according to claim 1, wherein the device is included in a magnetic read head.

15. Magnetoresistive device according to claim 1, wherein the device is included in a memory dot of a memory having a matrix of memory dots, the memory dote cooperating with a current switching means.

* * * * *